(12) United States Patent
Lin et al.

(10) Patent No.: US 10,340,218 B2
(45) Date of Patent: Jul. 2, 2019

(54) METHOD OF MANUFACTURING SEMICONDUCTOR STRUCTURE COMPRISING PLURALITY OF THROUGH HOLES USING METAL HARD MASK

(71) Applicant: TAIWAN SEMICONDUCTOR MANUFACTURING COMPANY LIMITED, Hsin-Chu (TW)

(72) Inventors: Yu-Hung Lin, Taichung (TW); Chun-Hsien Huang, Hsinchu (TW); I-Tseng Chen, Taipei (TW)

(73) Assignee: TAIWAN SEMICONDUCTOR MANUFACTURING COMPANY LIMITED, Hsin-chu (TW)

( * ) Notice: Subject to any disclaimer, the term of this patent is extended or adjusted under 35 U.S.C. 154(b) by 0 days.

(21) Appl. No.: 15/729,816

(22) Filed: Oct. 11, 2017

(65) Prior Publication Data
US 2018/0047666 A1 Feb. 15, 2018

Related U.S. Application Data

(63) Continuation of application No. 15/065,800, filed on Mar. 9, 2016, now Pat. No. 9,793,204.
(Continued)

(51) Int. Cl.
*H01L 23/522* (2006.01)
*H01L 23/528* (2006.01)
(Continued)

(52) U.S. Cl.
CPC ...... *H01L 23/5226* (2013.01); *H01L 21/0273* (2013.01); *H01L 21/0332* (2013.01);
(Continued)

(58) Field of Classification Search
None
See application file for complete search history.

(56) References Cited

U.S. PATENT DOCUMENTS

| 6,861,317 B1 * | 3/2005 | Verma | H01L 21/76829 |
| | | | 257/E21.577 |
| 7,985,676 B2 * | 7/2011 | Klee | H01L 21/0337 |
| | | | 257/E21.585 |

(Continued)

FOREIGN PATENT DOCUMENTS

| CN | 102709232 A | 10/2012 |
| CN | 103779268 A | 5/2014 |
| TW | 201222724 A | 6/2012 |

OTHER PUBLICATIONS

Corresponding Taiwan Patent Application Office Action dated Aug. 21, 2017 (6 pgs).
(Continued)

*Primary Examiner* — Dung A. Le
(74) *Attorney, Agent, or Firm* — Cooper Legal Group, LLC

(57) ABSTRACT

A method of manufacturing a semiconductor structure including a conductive structure, a dielectric layer, and a plurality of conductive features is disclosed. The dielectric layer is formed on the conductive structure. A plurality of through holes is formed in the dielectric layer using a metal hard mask, and at least one of the through holes exposes the conductive structure. The conductive features are formed in the through holes. At least one of the conductive features has a bottom surface and at least one sidewall. The bottom surface and the sidewall of the conductive feature intersect to form an interior angle. The interior angles of adjacent two of the conductive features have a difference less than or substantially equal to about 3 degrees.

14 Claims, 7 Drawing Sheets

Related U.S. Application Data

(60) Provisional application No. 62/256,619, filed on Nov. 17, 2015.

(51) Int. Cl.
| | |
|---|---|
| *H01L 21/311* | (2006.01) |
| *H01L 21/027* | (2006.01) |
| *H01L 21/033* | (2006.01) |
| *H01L 21/768* | (2006.01) |
| *H01L 21/8234* | (2006.01) |
| *H01L 27/088* | (2006.01) |
| *H01L 23/485* | (2006.01) |
| *H01L 29/78* | (2006.01) |

(52) U.S. Cl.
CPC .... *H01L 21/0337* (2013.01); *H01L 21/31144* (2013.01); *H01L 21/76802* (2013.01); *H01L 21/76804* (2013.01); *H01L 21/76877* (2013.01); *H01L 21/823475* (2013.01); *H01L 23/528* (2013.01); *H01L 27/088* (2013.01); *H01L 23/485* (2013.01); *H01L 23/522* (2013.01); *H01L 29/78* (2013.01)

(56) References Cited

U.S. PATENT DOCUMENTS

| | | |
|---|---|---|
| 9,184,060 B1 | 11/2015 | Lee |
| 2002/0055244 A1* | 5/2002 | Burbach ............... H01L 21/743 |
| | | 438/586 |
| 2002/0182857 A1 | 12/2002 | Liu et al. |
| 2004/0266106 A1* | 12/2004 | Lee .................. H01L 27/11517 |
| | | 438/257 |
| 2007/0105386 A1* | 5/2007 | Shih .................... H01L 21/0331 |
| | | 438/710 |
| 2008/0136037 A1 | 6/2008 | Arakawa |
| 2010/0130002 A1 | 5/2010 | Dad et al. |
| 2012/0129301 A1 | 5/2012 | Or-Bach et al. |
| 2012/0261826 A1 | 10/2012 | Kuo et al. |
| 2012/0270389 A1 | 10/2012 | Lin et al. |
| 2013/0240990 A1* | 9/2013 | Yin ....................... H01L 29/456 |
| | | 257/343 |

OTHER PUBLICATIONS

Corresponding Chinese Patent Application No. 201610551196.2 Office Action dated Aug. 1, 2018.

\* cited by examiner

US 10,340,218 B2

METHOD OF MANUFACTURING SEMICONDUCTOR STRUCTURE COMPRISING PLURALITY OF THROUGH HOLES USING METAL HARD MASK

PRIORITY CLAIM AND CROSS-REFERENCE

This application is a continuation of and claims priority to U.S. Non-Provisional application Ser. No. 15/065,800, titled "METHOD OF MANUFACTURING SEMICONDUCTOR STRUCTURE COMPRISING PLURALITY OF THROUGH HOLES USING METAL HARD MASK" (As Amended) and filed on Mar. 9, 2016, which claims priority to Provisional Application Ser. No. 62/256,619, titled "HARD MASK AND METHOD OF FORMING THE SAME" and filed on Nov. 17, 2015. U.S. Non-Provisional application Ser. No. 15/065,800 and Provisional Application Ser. No. 62/256,619 are incorporated herein by reference.

BACKGROUND

Integrated circuit devices such as transistors are formed over semiconductor wafers. The devices are interconnected through metal lines and vias to form functional circuits. In the formation of the metal lines and vias, a dielectric layer is etched to form through holes. The etching of the dielectric layer may involve a metal hard mask. Metal hard mask can be used in etching process to transfer patterns onto the semiconductor wafers. The metal hard mask can provide a desired etching profile and critical dimension control for decreasing geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
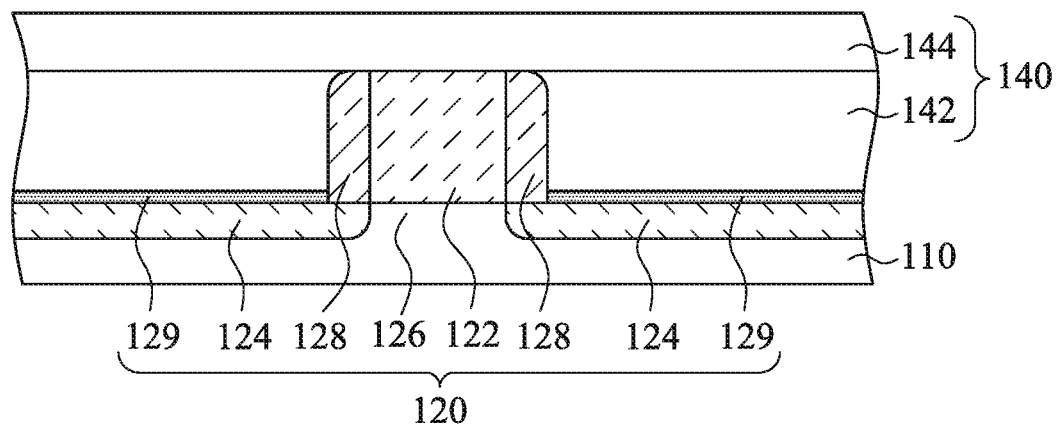
FIGS. 1A to 1F are cross-sectional views of a method for manufacturing a semiconductor structure in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIGS. 1A to 1F are cross-sectional views of a method for manufacturing a semiconductor structure in accordance with various embodiments of the present disclosure. Reference is made to FIG. 1A. A substrate 110 is provided. In some embodiments, the substrate 110 includes silicon. Alternatively, the substrate 110 may include germanium, silicon germanium, gallium arsenide or other appropriate semiconductor materials. Also alternatively, the substrate 110 may include an epitaxial layer. For example, the substrate 110 may have an epitaxial layer overlying a bulk semiconductor. Further, the substrate 110 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrate may be formed by selective epitaxial growth (SEG). Furthermore, the substrate 110 may include a semiconductor-on-insulator (SOI) structure. Also alternatively, the substrate 110 may include a buried dielectric layer, such as a buried oxide (BOX) layer, such as that formed by separation by implantation of oxygen (SIMOX) technology, wafer bonding, SEG, or other appropriate method. In some embodiments, the substrate 110 may include various doped regions depending on design situations (e.g., p-type wells or n-type wells). The doped regions may be doped with p-type dopants, such as boron or $BF_2$; n-type dopants, such as phosphorus or arsenic; or a combinations thereof. The doped regions may be formed directly in the substrate 110, in a P-well structure, in an N-well structure, in a dual-well structure, or in a raised structure.

A conductive structure 120 is formed in, on and/or above the substrate 110. The conductive structure 120 may be an electric element formed in, on and/or above the substrate 110. The electric element may include complementary metal-oxide-semiconductor (CMOS) transistors, diodes, resistors, capacitors, inductors, and other active and passive semiconductor devices. For clarity, a single electric element is depicted in FIG. 1A. In some other embodiments, however, the number of the electric elements can be plural and are in different types.

In FIG. 1A, the conductive structure 120 is a transistor. The transistor includes a gate structure 122, a plurality of source/drain features 124 (also referred to as S/D features), a channel 126, and a plurality of gate spacers 128. The channel 126 is present between the source/drain features 124, and the gate structure 122 is present on the channel 126. In some embodiments, the source/drain features 124 can be doping regions. The S/D features 124 may be formed by an ion implantation process or a diffusion process. N-type dopants such as phosphorus or arsenic may be used to form the S/D features 124 for an N-type field effect transistor (NFET), and P-type dopants such as boron may be used to form the S/D features 124 for a P-type FET. The S/D features 124 are aligned with the outer boundaries of the gate spacers 128, respectively. It is also understood that in some embodiments, lightly-doped source/drain (LDD) regions may be formed in the substrate 110 before the gate spacers 128 are formed. For reasons of simplicity, the LDD regions are not specifically illustrated herein.

In some other embodiments, the source/drain features 124 and the channel 126 are made of fin structures. In some other embodiments, the source/drain features 124 are epitaxy structures. The source/drain features 124 may include silicon (Si), silicon phosphorus (SiP), silicon carbide phosphorus (SiCP), gallium antimony (GaSb), or silicon germanium (SiGe) having a relatively low germanium concentration for an NFET. The source/drain features 124 may include germanium (Ge), germanium tin (GeSn), or silicon germanium (SiGe) having a relatively high germanium concentration for a PFET.

In some embodiments, the gate structure 122 may include gate dielectric layer(s) and a poly-silicon gate. The poly-silicon can be doped or undoped. Although doped poly-silicon is used as the gate in FIG. 1A, other silicon-based materials selected from the group including single crystal silicon, poly silicon, doped silicon, doped poly-silicon, amorphous silicon, and/or silicon-germanium can be used.

In some embodiments, a replacement gate (RPG) process scheme is employed. In some embodiments, in a RPG process scheme, a dummy polysilicon gate is formed first and is replaced later by a metal gate after high thermal budget processes are performed. That is, the gate structure 122 is a metal gate. The metal gate may include gate dielectric layer(s), capping layer(s), fill layer(s), and/or other suitable layers that are desirable in a metal gate stack. The metal gate may be deposited by ALD, PVD, CVD, or other suitable process.

In some embodiments, the transistor further includes a plurality of silicide contacts 129 respectively present on the S/D features 124. Silicides, which are compounds formed from a metal and silicon, are used for contacts in semiconductor devices. Silicide contacts 129 are thermally stable, have lower resistivity than polysilicon, and are good ohmic contacts. Silicide contacts 129 are also reliable, since the silicidation reaction eliminates many defects at an interface between a contact and a device feature. A technique used in the semiconductor manufacturing industry is self-aligned silicide ("salicide") processing. Silicide processing can be used in the fabrication of high-speed complementary metal oxide semiconductor (CMOS) devices. The silicide process converts the surface portions of the S/D features 124 into the silicide contacts 129. Silicide processing involves the deposition of a metal that undergoes a silicidation reaction with silicon (Si). In order to form silicide contacts 129 on the S/D features 124, oxide spacers are provided next to the gate structure 122. Metal material is then blanket deposited on the transistor. After heating the transistor to a temperature at which the metal reacts with the silicon of the S/D features 124 to form contacts, unreacted metal is removed. Silicide contacts 129 remain over the S/D features 124, while unreacted metal is removed from other areas.

A dielectric layer 140 is then formed on the substrate 110 and the conductive structure 120. The dielectric layer 140 can be an inter-layer (or inter-level) dielectric (ILD) layer. The dielectric layer 140 may be formed by chemical vapor deposition (CVD), high-density plasma CVD, spin-on, sputtering, or other suitable methods. In some embodiments, the dielectric layer 140 includes silicon oxide. In some other embodiments, the dielectric layer 140 may include silicon oxy-nitride, silicon nitride, or a low-k material.

In some embodiments, the dielectric layer 140 may include multiple portions stacked to each other. For example, a dielectric material can be deposited on the substrate 110 and the conductive structure 120. A planarizing process is then performed to partially remove the blanket dielectric material to form a first portion 142 of the dielectric layer 140 and expose a top surface of the gate structure 122 of the transistor. The planarizing process is, for example, a chemical mechanical polish (CMP) process. In some embodiments, the replacement gate (RPG) process can be subsequently performed if a dummy gate of the transistor is replaced to be a metal gate. Thereafter, another dielectric material is formed on the first portion 142 of the dielectric layer 140 to be a second portion 144. The first portion 142 and the second portion 144 of the dielectric layer 140 can be made of the same material or different materials.

Figure 1B:
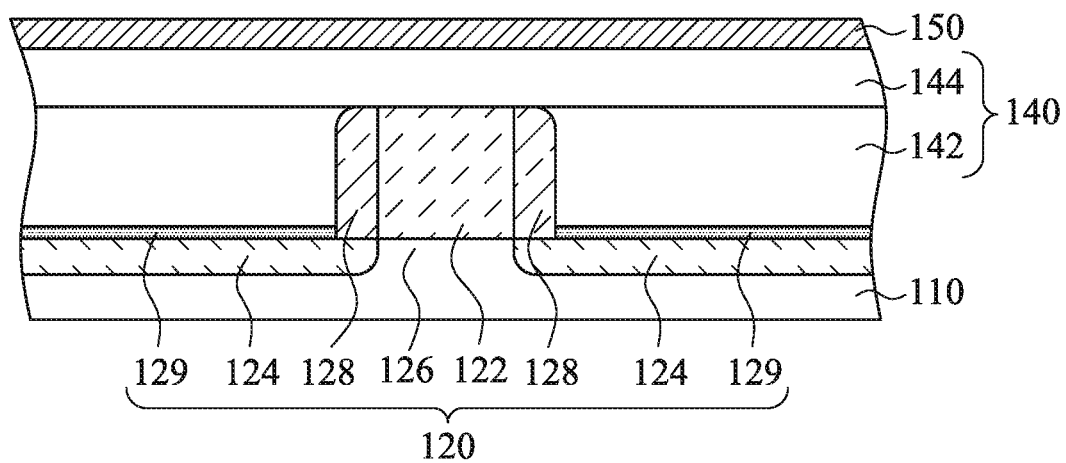

Reference is made to FIG. 1B. A metal hard mask 150 is formed on the dielectric layer 140 without performing a degas process. More specifically, the structure of FIG. 1A performs the formation process of the metal hard mask 150 after the dielectric layer 140 is formed. A degas process is omitted between the formation process of the metal hard mask 150 and the formation process of the dielectric layer 140. The degas process is to heat the structure of FIG. 1A to remove moisture thereof. In order to remove the moisture, the structure of FIG. 1A would be heated to high temperature, such as, about 150° C. to about 500° C. However, unstable grain size and density would be formed in the metal hard mask 150 if the metal hard mask 150 were formed when the structure of FIG. 1A was at the high temperature. The unstable grain size and density would make the refractive index and the extinction coefficient of the metal hard mask 150 unstable, lowering the quality of the metal hard mask 150. The low quality metal hard mask 150 would deteriorate the through hole formation (see FIGS. 1D and 1E) using the metal hard mask 150.

Figure 2:
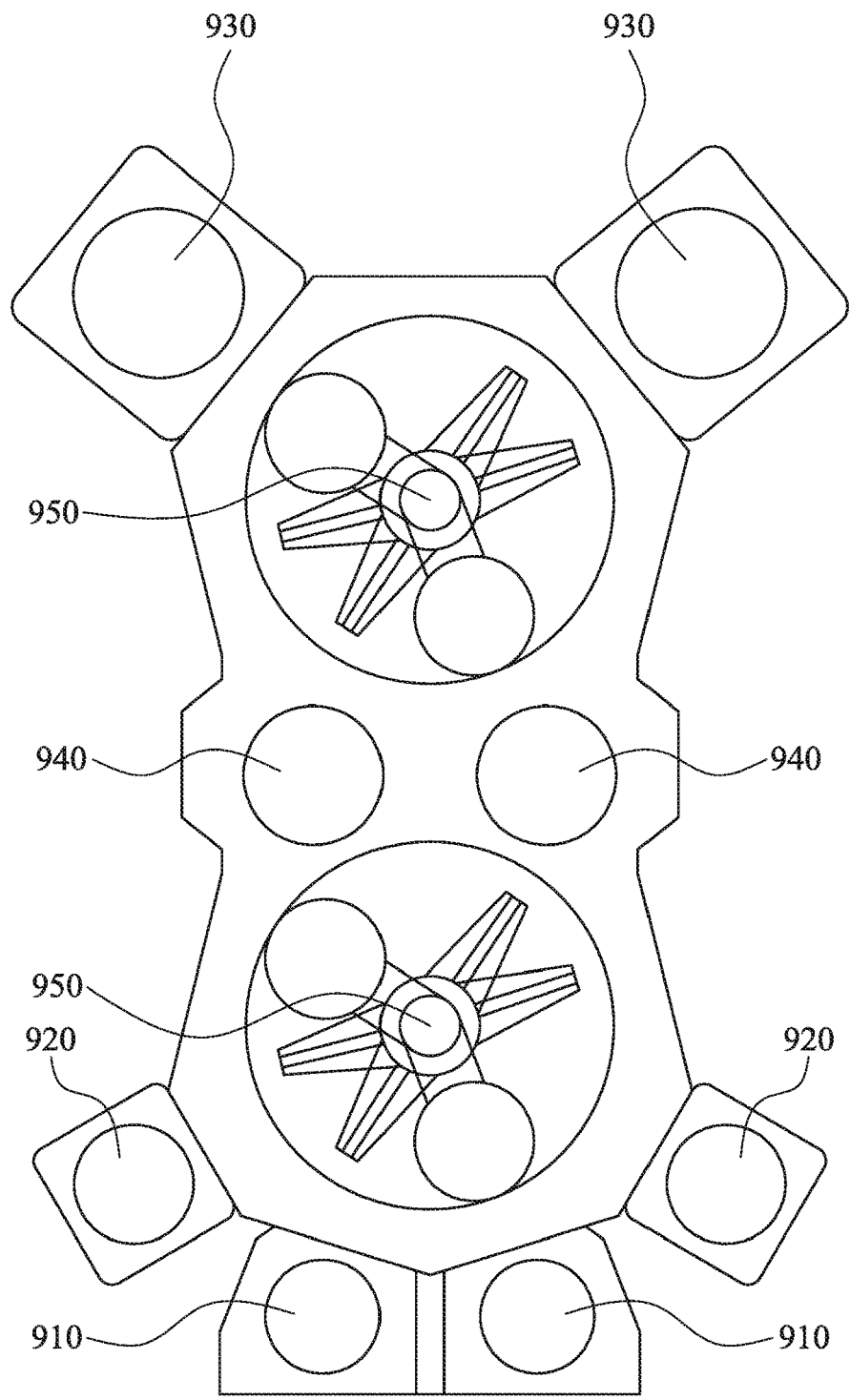
FIG. 2 is a plane view of a cluster tool 900 in accordance with some embodiments.

FIG. 2 is a plane view of a cluster tool 900 in accordance with some embodiments. During the formation process of the metal hard mask 150, the structure of FIG. 1A is loaded into the cluster tool 900. The cluster tool 900 includes at least one load lock 910, at least one degas chamber 920, at least one process chamber 930, at least one pass through chamber 940, and at least one robot blade 950. The structure of FIG. 1A (referred as a wafer) is placed in the cluster tool 900 from the load lock 910. The load lock 910 is then sealed. The load lock 910 is capable of creating an atmosphere depending on where the wafer is scheduled to be next. This may alter the gas content of the load lock 910 by such mechanisms as adding purified gases or creating a vacuum, along with other suitable means for adjusting the load lock 910 atmosphere. When the desired atmosphere has been reached, the corresponding door may be opened, and the wafer can be accessed. The degas chamber 920 is configured to degas the wafer. The process chamber 930 can be a PVD chamber or a CVD chamber for forming the metal hard mask 150 (see FIG. 1B) on the wafer. The pass through chamber 940 is a chamber to accommodate the transferring wafer. The robot blade 950 is configured to transfer the wafer.

Reference is made to FIGS. 1B and 2. In FIG. 1B, since the degas process is omitted, the wafer entering the load lock 910 of the cluster tool 900 is transferred to the process chamber 930 without entering the degas chamber 920. That is, the wafer is not heated before entering the process chamber 930. Or, the wafer may be performed at least one additional process before entering the process chamber 930. The wafer, however, is not be heated to a temperature as high as the degas process. In other words, the temperature of the wafer is not at high temperature. For example, the initial temperature of the dielectric layer 140 of the wafer for forming the metal hard mask 150 is about 15° C. to about 30° C. With such temperature, the quality of the metal hard mask 150 can be improved, and the refractive index and the extinction coefficient of the metal hard mask 150 can also be improved.

In some embodiments, the metal hard mask 150 can be made of titanium nitride, tantalum nitride, boron nitride, titanium, tantalum, or combinations thereof. The metal hard mask 150 may be made by performing physical vapor deposition (PVD) or CVD. The CVD method may be plasma enhanced CVD (PECVD), atomic layer deposition (ALD), or the like. In some embodiments, the precursors for the deposition of the metal hard mask 150 may include $TiCl_4$, $N_2$, Ar, $H_2$, and the like.

Figure 1C:
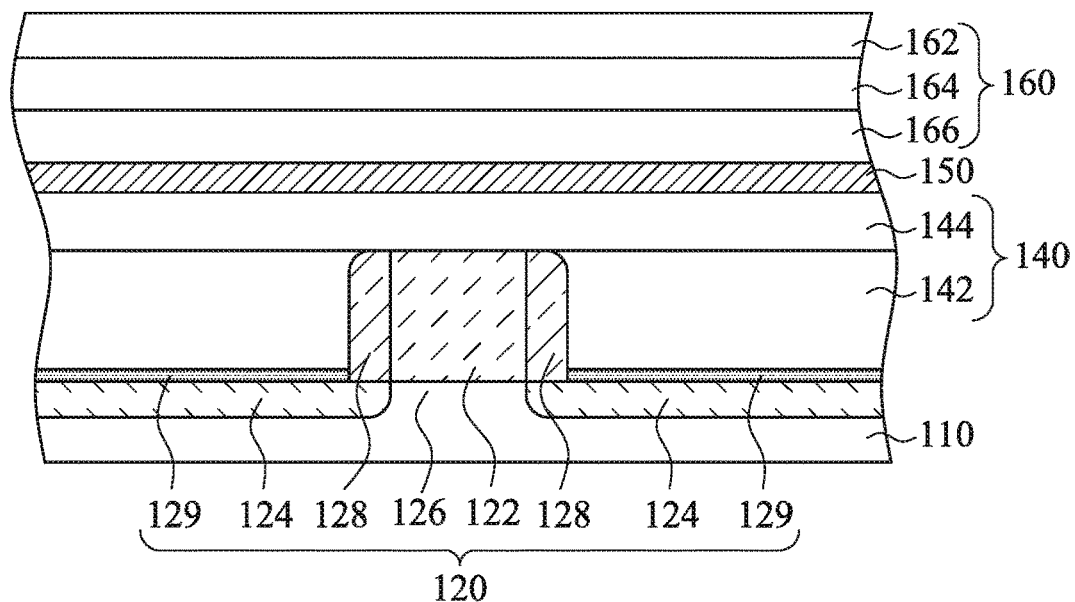

Reference is made to FIG. 1C. A lithography process defining the metal hard mask 150 is performed. In some embodiments, a tri-layer photoresist 160 may be used, including a photoresist (PR) layer 162 as the top or uppermost portion, a middle layer 164, and a bottom layer 166. The tri-layer photoresist 160 is disposed on the metal hard mask 150. The tri-layer photoresist 160 provides the PR layer 162, the middle layer 164 which may include antireflective layers or backside anti-reflective layers to aid in the exposure and focus of the PR processing, and the bottom layer 166 which may be a hard mask material; for example, a nitride. To pattern the tri-layer photoresist 160, the PR layer 162 is patterned using a mask, exposure to radiation, such as light or an excimer laser, for example, a bake or cure operation to harden the resist, and use of a developer to remove either the exposed or unexposed portions of the resist, depending on whether a positive resist or a negative resist is used, to form the pattern from the mask in the PR layer 162. This patterned PR layer 162 is then used to etch the underlying middle layer 164 and bottom layer 166 to form an etch mask for the target layer; here, the metal hard mask 150. In some other embodiments, the middle layer 164 and the bottom layer 166 can be omitted. That is, the photoresist 160 is a single-layer photoresist.

Figure 1D:
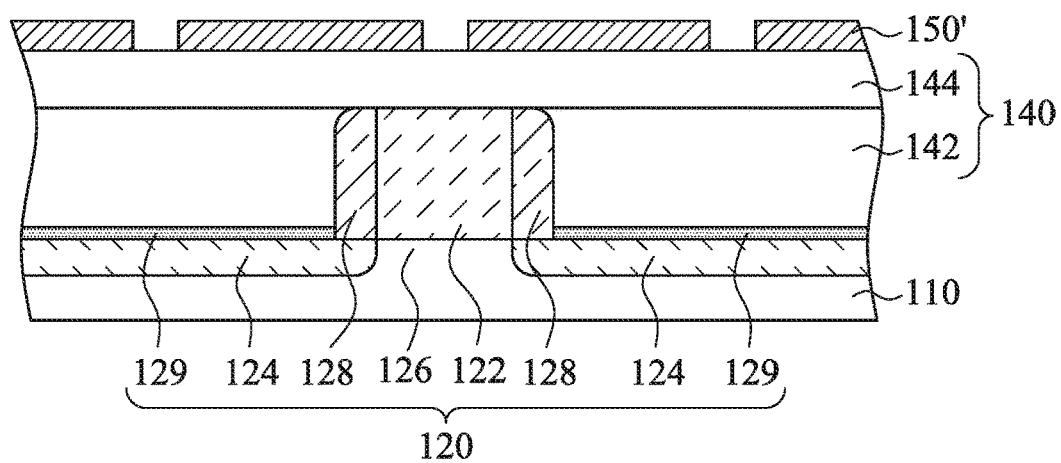

Reference is made to FIG. 1D. An etching process is performed to form patterned metal hard mask 150'. The PR layer 162 (see FIG. 1C) is patterned and is used as a mask during the etching process. In the etching process, the middle layer 164, the bottom layer 166, and the metal hard mask 150 (see FIG. 1C) may be etched by various methods, including a dry etch, a wet etch, or a combination of dry etch and wet etch. The dry etching process may implement fluorine-containing gas (e.g., $CF_4$, $SF_6$, $CH_2F_2$, $CHF_3$, and/or $C_2F_6$), chlorine-containing gas (e.g., $C_{12}$, $CHC_{16}$, $CC_{14}$, and/or $BC_{16}$), bromine-containing gas (e.g., HBr and/or $CHBR_3$), oxygen-containing gas, iodine-containing gas, other suitable gases and/or plasmas, or combinations thereof. The etching process may include a multiple-step etching to gain etch selectivity, flexibility and desired etch profile. After the metal hard mask 150 is patterned, the PR layer 162, the middle layer 164, and the bottom layer 166 are removed.

Figure 1E:
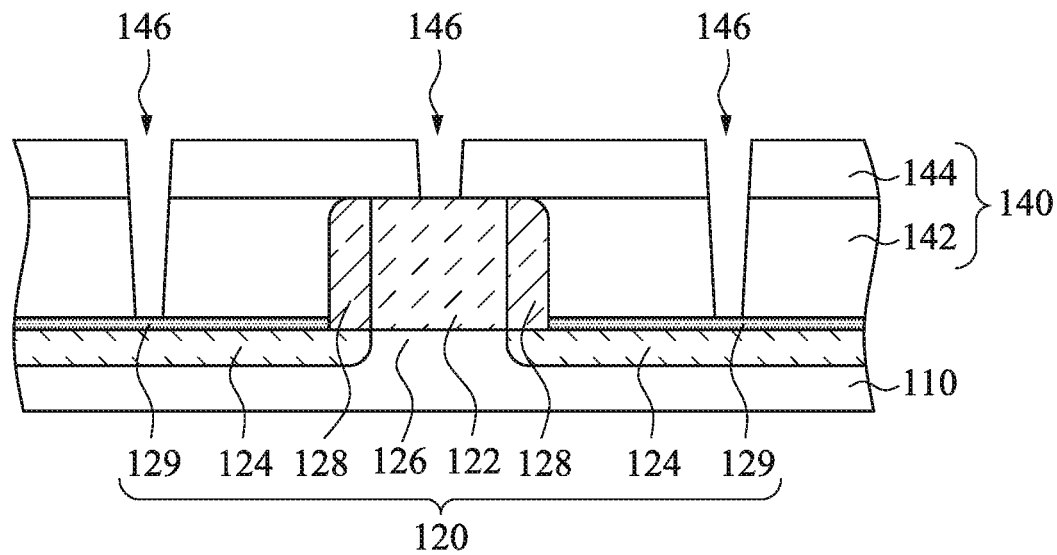

Reference is made to FIG. 1E. Using the patterned metal hard mask 150' as a mask, the dielectric layer 140 is etched to form a plurality of through holes 146 by various methods, including a dry etch, a wet etch, or a combination of dry etch and wet etch. The through holes 146 extend substantially vertically through the dielectric layer 140 and respectively expose the gate structure 122 and the silicide layers 129. The number of the through holes 146 in FIG. 1E is illustrative and should not limit the claimed scope of the present disclosure. A person having ordinary skill in the art may select a suitable number for the trough holes 146 according to actual situations.

Figure 1F:
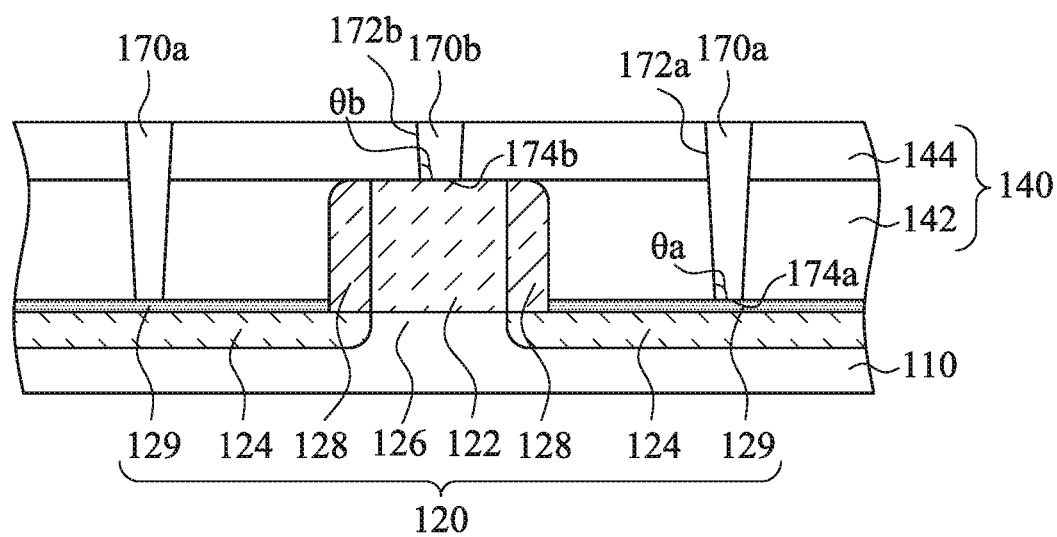

Reference is made to FIG. 1F. A plurality of conductive features 170a and 170b are respectively formed in the through holes 146. The conductive features 170a and 170b are metal contact in FIG. 1F. That is, the conductive features 170a and 170b and the dielectric layer 140 form a metal-dielectric (MD) layer. The conductive features 170a are respectively connected to the silicide layers 129 to be electrically connected to the S/D features 124 of the transistor, and the conductive feature 170b is connected to the gate structure 122 of the transistor. In some embodiments, metal materials can be filled in the through holes 146, and the excessive portions of the metal materials are removed by performing a CMP process to form the conductive features 170a and 170b. The conductive features 170a and 170b can be made of tungsten, aluminum, copper, or other suitable materials. The conductive features 170a and 170b may also have composite structures, including, e.g., barrier and adhesion layers, such as titanium/titanium nitride or tantalum nitride, and other layers as well.

In FIG. 1F, the conductive feature 170a has a bottom surface 174a and at least one sidewall 172a. The bottom surface 174a and the sidewall 172a of the conductive feature 170a intersect to form an interior angle θa. The interior angle θa is about 92 degrees to about 98 degrees. The conductive feature 170b has a bottom surface 174b and at least one sidewall 172b. The bottom surface 174b and the sidewall 172b of the conductive feature 170b intersect to form an interior angle θb. The interior angle θb is about 92 degrees to about 98 degrees. Moreover, the interior angles θa and θb of adjacent two of the conductive features 170a and 170b have a difference less than or substantially equal to about 3 degrees. That is, the profiles of the conductive features 170a and 170b are substantially consist, and the formation of the conductive features 170a and 170b (or the through holes 146 of FIG. 1E) is stable. The terms "substantially" as used herein may be applied to modify any quantitative representation which could permissibly vary without resulting in a change in the basic function to which it is related.

According to FIGS. 1A to 1F, since the metal hard mask is formed when the initial temperature of the dielectric layer of the wafer is about 15° C. to about 30° C., or the metal hard mask is formed without performing a degas process, the grain size and density of the metal hard mask is stable. As such, the quality of the metal hard mask can be improved, and the refractive index and the extinction coefficient of the metal hard mask can also be improved. This improvement makes good profiles of the conductive features formed thereafter.

Figure 3A:
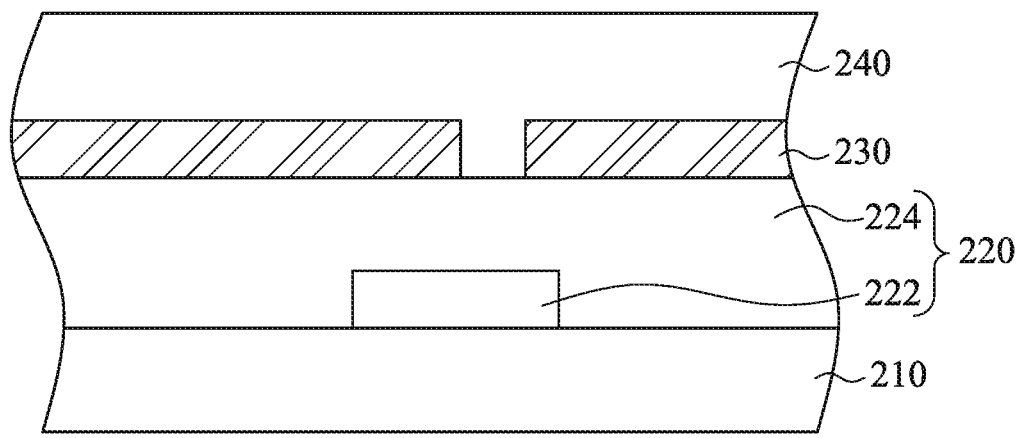
FIGS. 3A to 3F are cross-sectional views of a method for manufacturing a semiconductor structure in accordance with various embodiments of the present disclosure.

FIGS. 3A to 3F are cross-sectional views of a method for manufacturing a semiconductor structure in accordance with various embodiments of the present disclosure. Reference is made to FIG. 3A. A substrate 210 is provided. In some embodiments, the substrate 210 is a semiconductor substrate such as a bulk silicon substrate, a semiconductor wafer, a silicon-on-insulator (SOI) substrate, or a silicon germanium substrate, although it may include other semiconductor materials such as group III, group IV, and/or group V elements.

A semiconductor structure 220 is formed on the substrate 210. For forming the semiconductor structure 220, an electric element 222 is formed in, on and/or above the substrate 210. The electric element 222 may include complementary metal-oxide-semiconductor (CMOS) transistors, diodes, resistors, capacitors, inductors, and other active and passive semiconductor devices. For clarity, single electric element 222 is depicted in FIG. 3A. In some other embodiments, however, the number of the electric elements 222 can be plural and are in different types. Subsequently, an interconnect structure 224 is formed on the electric element 222. In some embodiments, the interconnect structure 224 covers the electric element 222. The interconnect structure 224 is configured to interconnect the electric element(s) 222. The interconnect structure 224 includes a plurality of metallization layers including metal lines and vias (not shown) in a plurality of dielectric layers. The metal lines and vias may be formed of copper or copper alloys, and may be formed using the well-known damascene processes. The dielectric layers in the interconnect structure 224 may be made of low-k dielectric material, extreme low-k dielectric material, or silicon. The low-k dielectric material is a material with a small dielectric constant relative to silicon dioxide, whose dielectric constant is about 3.9, and the extreme low-k dielectric material has a dielectric constant lower than about 2.5. In some other embodiments, the interconnect structure 224 may include commonly known inter-layer dielectric (ILDs) and inter-metal dielectrics (IMDs).

A conductive structure 230 is formed on the semiconductor structure 220. In other words, the interconnect structure 224 is formed between the electric element 222 and the conductive structure 230. In FIG. 3A, the conductive structure 230 has a plurality of portions. For example, a conductive layer (not shown) and a photoresist (not shown) can be sequentially formed on the semiconductor structure 220. The photoresist is then exposed and developed to become a patterned photoresist. Subsequently, the conductive layer is then etched based on the patterned photoresist to form the plurality of portions. In some embodiments, the conductive structure 230 may be metal pads including aluminum (Al), and hence may also be referred to as an aluminum pad, although it may also be made of copper (Cu), silver (Ag), gold (Au), nickel (Ni), tungsten (W), alloys, or combinations thereof. In some other embodiments, the conductive structure 230 may be made of aluminum copper (AlCu). The conductive structure 230 can be electrically connected to the electric element 222, for example, through the underlying interconnection structure 224.

A dielectric layer 240 is formed to cover the conductive structure 230. The dielectric layer 240 may be formed by chemical vapor deposition (CVD), high-density plasma CVD, spin-on, sputtering, or other suitable methods. In some embodiments, the dielectric layer 240 includes silicon oxide. In some other embodiments, the dielectric layer 240 may include silicon oxy-nitride, silicon nitride, or a low-k material.

Figure 3B:
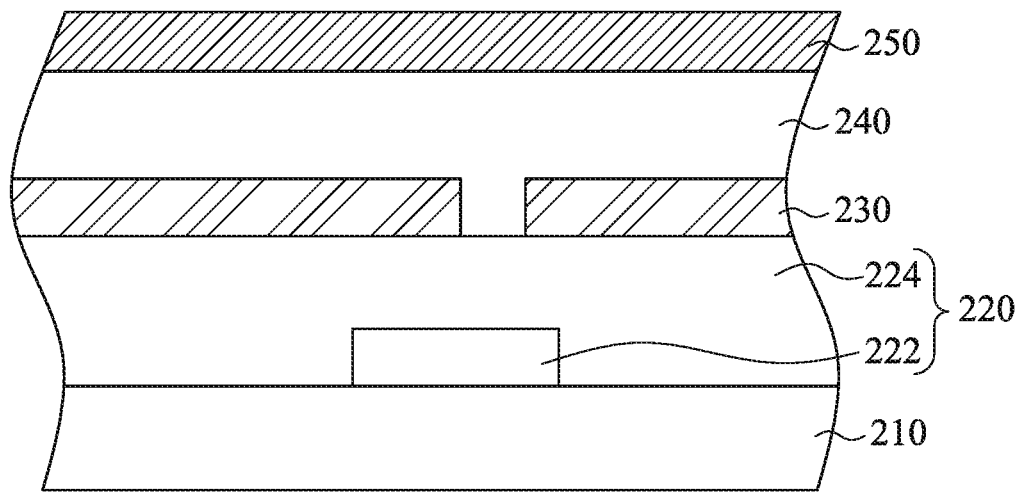

Reference is made to FIG. 3B. A metal hard mask 250 is formed on the dielectric layer 240 without performing a degas process. More specifically, the structure of FIG. 3A performs the formation process of the metal hard mask 250 after the dielectric layer 240 is formed. A degas process is omitted between the formation process of the metal hard mask 250 and the formation process of the dielectric layer 240.

Reference is made to FIGS. 3B and 2. In FIG. 3B, since the degas process is omitted, the structure of FIG. 3A (referred as a wafer) entering the load lock 910 of the cluster tool 900 is transferred to the process chamber 930 without entering the degas chamber 920. That is, the wafer is not heated before entering the process chamber 930. Or, the wafer may be performed at least one additional process before entering the process chamber 930. The wafer, however, is not be heated to a temperature as high as the degas process. In other words, the temperature of the wafer is not at high temperature. For example, the initial temperature of the dielectric layer 240 of the wafer for forming the metal hard mask 250 is about 15° C. to about 30° C. With such temperature, the quality of the metal hard mask 250 can be improved, and the refractive index and the extinction coefficient of the metal hard mask 250 can also be improved.

In some embodiments, the metal hard mask 250 can be made of titanium nitride, tantalum nitride, boron nitride, titanium, tantalum, or combinations thereof. The metal hard mask 250 may be made by performing physical vapor deposition (PVD) or CVD. The CVD method may be plasma enhanced CVD (PECVD), atomic layer deposition (ALD), or the like. In some embodiments, the precursors for the deposition of the metal hard mask 250 may include $TiCl_4$, $N_2$, Ar, $H_2$, and the like.

Figure 3C:
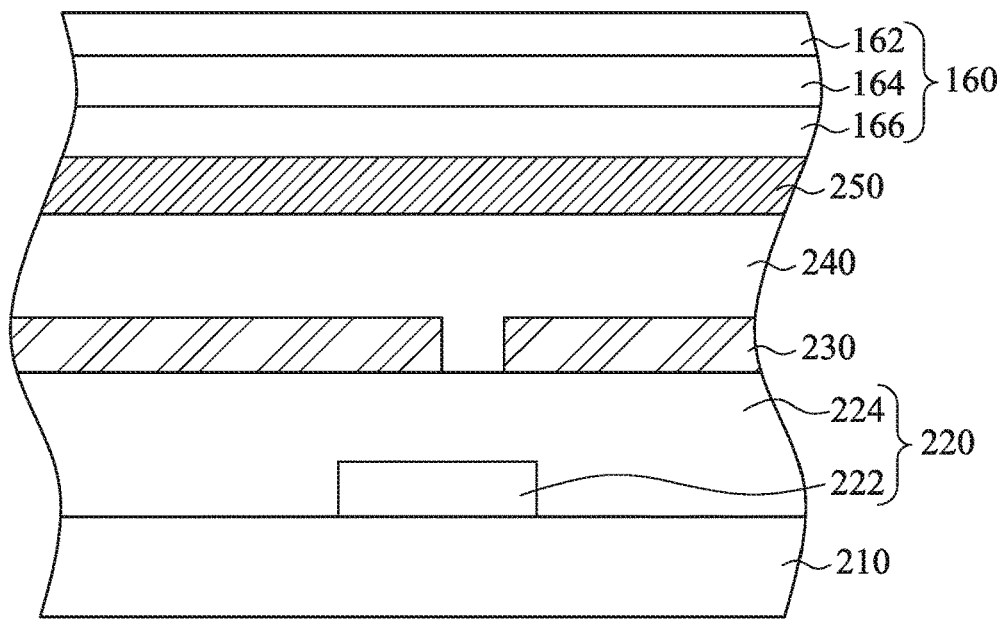

Reference is made to FIG. 3C. A lithography process defining the metal hard mask 250 is performed. In some embodiments, a tri-layer photoresist 160 may be used, including a photoresist (PR) layer 162 as the top or uppermost portion, a middle layer 164, and a bottom layer 166. The tri-layer photoresist 160 is disposed on the metal hard mask 350. In some other embodiments, the middle layer 164 and the bottom layer 166 can be omitted. That is, the photoresist 160 is a single-layer photoresist.

Figure 3D:
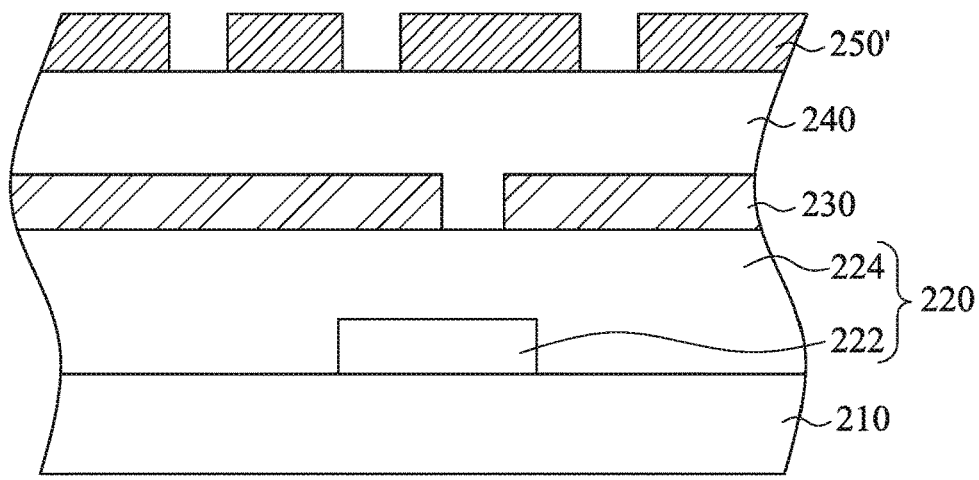

Reference is made to FIG. 3D. An etching process is performed to form patterned metal hard mask 250'. The PR layer 162 (see FIG. 3C) is patterned and is used as a mask during the etching process. In the etching process, the middle layer 164, the bottom layer 166, and the metal hard mask 150 (see FIG. 3C) may be etched by various methods, including a dry etch, a wet etch, or a combination of dry etch and wet etch. The dry etching process may implement fluorine-containing gas (e.g., $CF_4$, $SF_6$, $CH_2F_2$, $CHF_3$, and/or $C_2F_6$), chlorine-containing gas (e.g., $C_{12}$, $CHC_{16}$, $CC_{14}$, and/or $BC_{16}$), bromine-containing gas (e.g., HBr and/or $CHBR_3$), oxygen-containing gas, iodine-containing gas, other suitable gases and/or plasmas, or combinations thereof. The etching process may include a multiple-step etching to gain etch selectivity, flexibility and desired etch profile. After the metal hard mask 250 is patterned, the PR layer 162, the middle layer 164, and the bottom layer 166 are removed.

Figure 3E:
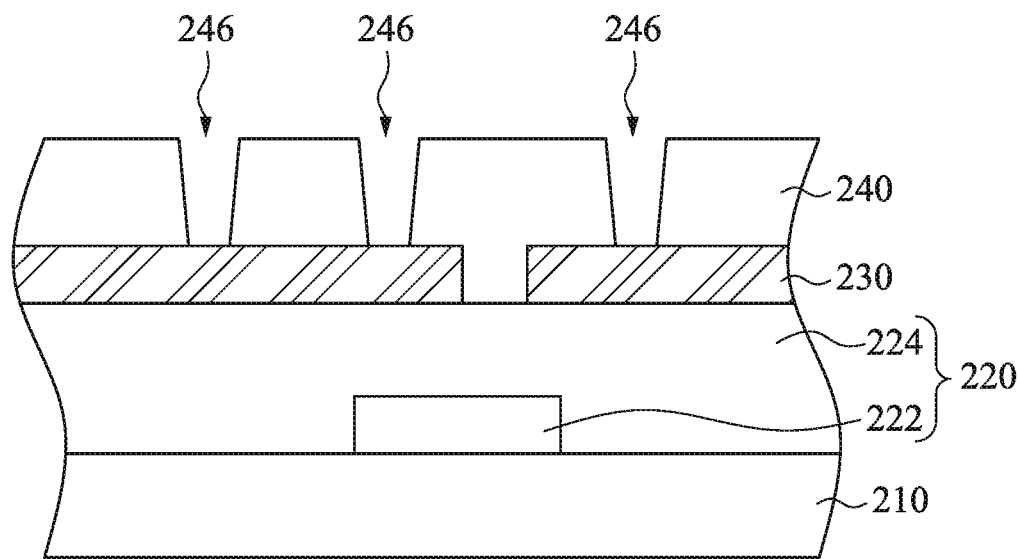

Reference is made to FIG. 3E. Using the patterned metal hard mask 250' as a mask, the dielectric layer 240 is etched to form a plurality of through holes 246 by various methods, including a dry etch, a wet etch, or a combination of dry etch and wet etch. The through holes 246 extend substantially vertically through the dielectric layer 240 and expose the conductive structure 230. The number of the through holes 246 in FIG. 3E is illustrative and should not limit the claimed scope of the present disclosure. A person having ordinary skill in the art may select a suitable number for the trough holes 246 according to actual situations.

Figure 3F:
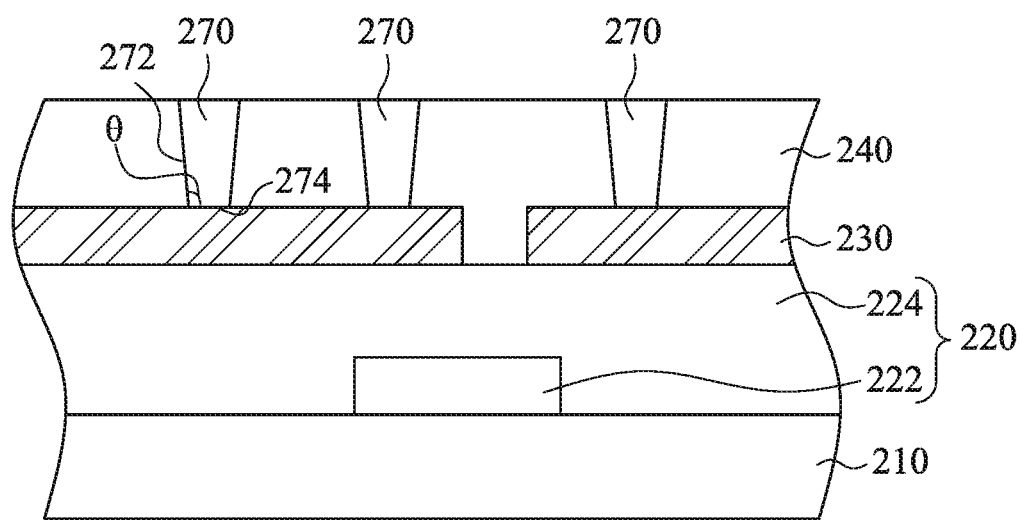

Reference is made to FIG. 3F. A plurality of conductive features 270 are respectively formed in the through holes 246. The conductive features 270 are vias in FIG. 3F. In some embodiments, metal materials can be filled in the through holes 246, and the excessive portions of the metal materials are removed by performing a CMP process to form the conductive features 270. The conductive features 270 can be made of tungsten, aluminum, copper, or other suitable materials.

In FIG. 3F, the conductive feature 270 has a bottom surface 274 and at least one sidewall 272. The bottom surface 274 and the sidewall 272 of the conductive feature 270 intersect to form an interior angle θ. The interior angle θ is about 92 degrees to about 98 degrees. Moreover, the interior angles θ of adjacent two of the conductive features 270 have a difference less than or substantially equal to about 3 degrees. That is, the profiles of the conductive features 270 are substantially consist, and the formation of the conductive features 270 (or the through holes 246 of FIG. 3E) is stable. The terms "substantially" as used herein may be applied to modify any quantitative representation which could permissibly vary without resulting in a change in the basic function to which it is related.

According to FIGS. 3A to 3F, since the metal hard mask is formed when the initial temperature of the dielectric layer of the wafer is about 15° C. to about 30° C., or the metal hard mask is formed without performing a degas process, the grain size and density of the metal hard mask is stable. As such, the quality of the metal hard mask can be improved, and the refractive index and the extinction coefficient of the metal hard mask can also be improved. This improvement makes good profiles of the conductive features formed thereafter.

According to some embodiments, a semiconductor structure includes a conductive structure, a dielectric layer, and a plurality of conductive features. The dielectric layer is present on the conductive structure. The dielectric layer has a plurality of through holes therein, and at least one of the through holes exposes the conductive structure. The conductive features are respectively present in the through holes. At least one of the conductive features has a bottom surface and at least one sidewall. The bottom surface and the sidewall of the conductive feature intersect to form an interior angle. The interior angles of adjacent two of the conductive features have a difference less than or substantially equal to about 3 degrees.

According to some embodiments, a method for manufacturing a semiconductor structure includes forming a dielectric layer on a conductive structure. A hard mask is formed on the dielectric layer without performing a degas process.

According to some embodiments, a method for manufacturing a semiconductor structure includes forming a dielectric layer on a conductive structure. A metal hard mask is formed on the dielectric layer. An initial temperature of the dielectric layer for forming the metal hard mask is about 15° C. to about 30° C.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure comprising:
    forming a first portion of a dielectric layer to conceal a conductive structure;
    removing some of the first portion of the dielectric layer to expose a top surface of the conductive structure, wherein a top of the first portion of the dielectric layer is at or above the top surface of the conductive structure after removing some of the first portion of the dielectric layer;
    forming a second portion of the dielectric layer over the first portion of the dielectric layer and over the top surface of the conductive structure;
    forming a metal hard mask over the dielectric layer;
    patterning the metal hard mask to form a patterned metal hard mask;
    patterning the first portion of the dielectric layer and the second portion of the dielectric layer with the patterned metal hard mask to define a first through hole extending through the first portion of the dielectric layer and the second portion of the dielectric layer; and
    patterning the second portion of the dielectric layer with the patterned metal hard mask to define a second through hole extending through the second portion of the dielectric layer.

2. The method of claim 1, wherein:
    the conductive structure comprises a source/drain feature and a gate structure, and
    removing some of the first portion of the dielectric layer to expose the top surface of the conductive structure comprises:
        exposing a top surface of the gate structure.

3. The method of claim 2, wherein the source/drain feature remains concealed by the dielectric layer after removing some of the first portion of the dielectric layer to expose the top surface of the conductive structure.

4. The method of claim 1, wherein:
    the conductive structure comprises a source/drain feature and a gate structure, and
    patterning the metal hard mask comprises:
        forming a first opening in the metal hard mask over the source/drain feature and forming a second opening in the metal hard mask over the gate structure.

5. The method of claim 4, wherein:
    patterning the first portion of the dielectric layer and the second portion of the dielectric layer with the patterned metal hard mask to define the first through hole extending through the first portion of the dielectric layer and the second portion of the dielectric layer comprises:
        patterning the first portion of the dielectric layer and the second portion of the dielectric layer through the first opening in the metal hard mask; and
    patterning the second portion of the dielectric layer with the patterned metal hard mask to define the second through hole extending through the second portion of the dielectric layer comprises:
        patterning the second portion of the dielectric layer through the second opening in the metal hard mask.

6. The method of claim 1, wherein:
    the conductive structure comprises a silicide contact, and
    patterning the first portion of the dielectric layer and the second portion of the dielectric layer with the patterned metal hard mask to define a first through hole extending through the first portion of the dielectric layer and the second portion of the dielectric layer, comprises:
  exposing the silicide contact through the first through hole.

7. The method of claim 1, wherein the second through hole extends merely through the second portion of the dielectric layer.

8. The method of claim 1, wherein a material composition of the first portion of the dielectric layer is different than a material composition of the second portion of the dielectric layer.

9. The method of claim 1, comprising:
  forming a first conductive feature in the first through hole and a second conductive feature in the second through hole.

10. A method for manufacturing a semiconductor structure comprising:
  forming a first portion of a dielectric layer over a first portion of a conductive structure;
  forming a second portion of the dielectric layer over an exposed, second portion of the conductive structure and over the first portion of the dielectric layer;
  forming a metal hard mask over the dielectric layer;
  patterning the metal hard mask to form a patterned metal hard mask;
  patterning the first portion of the dielectric layer and the second portion of the dielectric layer with the patterned metal hard mask to define a first through hole extending through the first portion of the dielectric layer and the second portion of the dielectric layer; and
  patterning the second portion of the dielectric layer with the patterned metal hard mask to define a second through hole extending through the second portion of the dielectric layer.

11. The method of claim 10, wherein forming the second portion of the dielectric layer comprises:
  forming the second portion of the dielectric layer to contact the second portion of the conductive structure.

12. The method of claim 10, wherein a material composition of the first portion of the dielectric layer is different than a material composition of the second portion of the dielectric layer.

13. The method of claim 10, wherein the first portion of the conductive structure is a source/drain feature and the second portion of the conductive structure is a gate structure.

14. The method of claim 10, comprising:
  forming a first conductive feature in the first through hole and a second conductive feature in the second through hole.

* * * * *